United States Patent
Je et al.

(10) Patent No.: US 9,366,786 B2
(45) Date of Patent: Jun. 14, 2016

(54) METHOD FOR MANUFACTURING X-RAY/γ-RAY FOCUSING OPTICAL SYSTEM USING ATOMIC LAYER DEPOSITION

(75) Inventors: Jung Ho Je, Seoul (KR); Jiwon Jung, Gyungbuk (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 219 days.

(21) Appl. No.: 13/976,634

(22) PCT Filed: Oct. 28, 2011

(86) PCT No.: PCT/KR2011/008143
§ 371 (c)(1),
(2), (4) Date: Jun. 27, 2013

(87) PCT Pub. No.: WO2012/091269
PCT Pub. Date: Jul. 5, 2012

(65) Prior Publication Data
US 2013/0280421 A1     Oct. 24, 2013

(30) Foreign Application Priority Data
Dec. 29, 2010  (KR) .................. 10-2010-0138051

(51) Int. Cl.
*G02B 3/08*   (2006.01)
*B82Y 10/00*  (2011.01)
*G21K 1/06*   (2006.01)
*C23C 16/455* (2006.01)

(52) U.S. Cl.
CPC . *G02B 3/08* (2013.01); *B82Y 10/00* (2013.01); *C23C 16/45555* (2013.01); *G21K 1/062* (2013.01); *G21K 1/067* (2013.01); *G21K 2201/061* (2013.01); *G21K 2201/067* (2013.01)

(58) Field of Classification Search
None
See application file for complete search history.

(56) References Cited

U.S. PATENT DOCUMENTS

| | | | |
|---|---|---|---|
| 6,249,764 B1 * | 6/2001 | Kamae et al. | 704/270.1 |
| 7,365,918 B1 * | 4/2008 | Yun et al. | 359/742 |
| 2003/0219095 A1 * | 11/2003 | Watanabe et al. | 378/35 |
| 2005/0072931 A1 * | 4/2005 | Albagli et al. | 250/370.11 |
| 2007/0265159 A1 * | 11/2007 | Elam et al. | 502/263 |
| 2010/0227476 A1 * | 9/2010 | Peck | 438/680 |

FOREIGN PATENT DOCUMENTS

| | | |
|---|---|---|
| JP | 07-084096 A | 3/1995 |
| JP | 07-120597 A | 5/1995 |
| JP | 2002-350593 A | 12/2012 |

OTHER PUBLICATIONS

Aaltonen et al. "Atomic Layer Deposition of Platinum Thin Films," 2003, Chem. Mater. vol. 15, pp. 1924-1928.*
Aaltonen et al. "Atomic Layer Deposition of Iridium Thin Films," 2004, Journal of the Electrochemical Society, 151(8), pp. G489-G492.*

(Continued)

*Primary Examiner* — Shamim Ahmed
*Assistant Examiner* — Bradford Gates
(74) *Attorney, Agent, or Firm* — Steptoe & Johnson LLP

(57) ABSTRACT

The present invention relates to a method for manufacturing an X-ray/γ-ray focusing optical system comprising the steps of: providing a capillary substrate; and sequentially accumulating a plurality of alternation layers, each consisting of an X-ray/γ-ray opaque material and an X-ray/γ-ray transparent material, on an inner surface of the capillary substrate in a Fresnel pattern by atomic layer deposition.

12 Claims, 5 Drawing Sheets

(56) References Cited

OTHER PUBLICATIONS

Park et al. "Selective area atomic layer deposition of rhodium and effective work function characterization in capacitor structures," 2006, Applied Physics Letters, vol. 89.*

Lee et al. "Conformal Al2O3 dielectric layer deposited by atomic layer deposition for graphene-based nanoelectronics," 2008, Applied Physics Letters, vol. 92.*

International Search Report of PCT/KR2011/008143.

* cited by examiner

METHOD FOR MANUFACTURING X-RAY/γ-RAY FOCUSING OPTICAL SYSTEM USING ATOMIC LAYER DEPOSITION

CLAIM FOR PRIORITY

This application claims priority under 35 USC 371 to International Application No. PCT/KR2011/008143, filed on Oct. 28, 2011, which claims priority to Korean Patent Application No. 10-2010-0138051, filed Dec. 29, 2010, each of which is hereby incorporated by reference in its entirety.

TECHNICAL FIELD

The present invention relates to a method of manufacturing an X-ray/γ-ray focusing optical system, and, more particularly, to a method of manufacturing an X-ray/γ-ray focusing optical system using atomic layer deposition.

BACKGROUND ART

Recently, as various types of nanostructures having a size of nanometers have started to be researched and applied extensively to the fields of semiconductor devices, energy, displays, biological technologies, medical services and the like, nanoscale-resolution imaging technologies or nanoscale electromagnetic wave focusing technologies have become very important issues.

Among such technologies, particularly, X-ray microscopy can provide accurate nanoscale chemical, structural and morphological information due to the inherent characteristics thereof such as high transmittance, short wavelength and the like, so it will be expected that it can provide complimentary material information that can not be provided by an optical microscope or an electron microscope.

According to the Rayleigh criterion R=0.5λ/NA (here, R is resolution, λ is wavelength, and NA is numeric aperture), X-rays and γ-rays can be theoretically focused in a size similar to the wavelength thereof. However, to date, a conventional X-ray/γ-ray focusing optical system has not reached the theoretical X-ray/γ-ray focusing size because it was difficult to manufacture this optical system that can focus X-rays and g-rays, so research into whether any type of optical system is theoretically effective has been actively carried out.

An X-ray focusing optical system for focusing X-rays having a refractive index of less than 1.0 and a very short wavelength region requires far stricter conditions than general optical systems. That is, in the X-ray focusing optical system, X-rays are refracted or reflected at a very small angle because their interaction with a material is very weak. In other words, in the X-ray focusing optical system, it is difficult to obtain a large numeric aperture, and the focusing efficiency of X-rays and γ-rays becomes very low, so there are many difficulties in obtaining nanometer-scale X-ray and γ-ray beams. All over the world, there have been various attempts to improve X-ray/γ-ray focusing optical systems. Among them, as typical examples thereof, there are a Fresnel Zone Plate and a Multilayer Laue Lens.

As shown in FIG. 1, a Fresnel Zone Plate has a structure in which transparent and opaque circular rings are repeatedly and alternately arranged, and is an optical system for focusing light rays using a diffraction phenomenon of electromagnetic waves. A general Fresnel Zone Plate has a circular lattice shape, and includes transparent layers through which X-rays and γ-rays are transmitted and opaque layers which serves to change a phase, the transparent layers and the opaque layers being alternately arranged. In this case, X-rays and γ-rays diffracted by each of the layers converge into a focus based on a principle of constructive interference occurring at specific points. Each of the layers is disposed at the position which is away from the origin by the distance calculated by Fresnel Equation below:

$$r^2_n = n\lambda f + n^2\lambda^2/4$$

Here, $r_n$ is a position of an $n_{th}$ layer, and f is a focal distance. The second term may be omitted when $n\lambda \ll f$. The thickness $\Delta r$ of the outermost layer is $r_n - r_{n-1}$. The resolution of a Fresnel Zone Plate is approximately equal to the thickness $\Delta r$ of the outermost layer (R=1.22Δr when the Fresnel Zone Plate is a circular zone plate, and R=Δr when the Fresnel Zone Plate is a linear zone plate). Further, the optical contrast between a light-transmitting layer and a light absorbing layer, the depth of light transmission (the size of an optical system in a direction of beam progressing), the accuracy of each layer, the original size of incident beam, coherences, and the like become important factors for determining the resolution of the Fresnel Zone Plate.

As conventional methods of manufacturing a Fresnel Zone Plate, there are a method of manufacturing a Fresnel Zone Plate using electron beam lithography and an electrochemical technology and a method of manufacturing a Fresnel Zone Plate using a sputtering-slicing process.

The focusing efficiency of a zone plate is influenced by the thickness of the outermost layer, raw materials, X-ray and γ-ray energy, and the like. Particularly, the focusing efficiency thereof greatly depends on an aspect ratio (ratio of the thickness of the outermost layer to the depth of light transmission).

First, as shown in FIG. 2, in the method of manufacturing a zone plate using electron beam lithography and an electrochemical technology, in order to obtain a large aspect ratio, a $Si_3N_4$ membrane is coated with a photosensitizing agent (PMMA, ZEP or the like) (ST21), a zone plate pattern is formed on the $Si_3N_4$ membrane coated with the photosensitizing agent by electron beam lithography (ST22), and then the zone plate pattern is deposited with gold (Au) by electroplating to complete a zone plate (ST23).

This method is an existing method of manufacturing an X-ray/γ-ray focusing optical system in the highest performance (at a level of 20 nm), and is a bottom-up growing method. The line width of the outermost layer of the zone plate manufactured by this method greatly depends on the intensity of a focused electron beam.

Recently, with the advancement of technology, it is known that an electron beam can be focused to a level of about 1 nm or less. However, the thickness of the outermost layer of the zone plate manufactured by this method is currently at least 15 nm (in this to case, the depth of light transmission is about 200 nm) because of the resolution of a photosensitizing agent, the stability of equipment (vibration or the like), the scattering of electrons in an electron beam process, or the like.

Further, when this method is used, light transmission depth determining a focusing efficiency is substantially limited to 1 μm or less, so the focusing efficiency of a Fresnel zone plate used in light X-rays and γ-rays is very low (several %), and as shown in FIG. 3, a flat Fresnel zone plate ((a) of FIG. 3) can be manufactured, but an ideal Fresnel zone plate ((b) of FIG. 3) cannot be manufactured.

Next, as shown in FIG. 4, in the method of manufacturing a zone plate using a sputtering-slicing process, the zone plate is manufactured by the steps of: rotating a wire substrate (ST31); depositing the rotating wire substrate with an opaque material by sputtering (ST32); depositing the rotating wire substrate with a transparent material by sputtering (ST33); alternately repeating the steps ST32 and ST33 (ST34); and slicing the wire substrate alternately deposited with the opaque and transparent materials. This method can manufacture a structure having a high aspect ratio, but it is difficult to finely control a structure and to focus X-rays and γ-rays at a high resolution of 20 nm or less.

Second, as shown in FIG. 5, a multilayer Laue lens (MLL) is manufactured by depositing, cutting and grinding a thin film, not by photolithography.

FIG. 6 shows a conventional method of manufacturing a multilayer Laue lens (MLL) using physical vapor deposition (PVD). In this method, the multilayer Laue lens (MLL) is manufactured by the steps of: depositing a flat silicon wafer with several hundreds or several thousands of thin film layers to predetermined thickness by sputtering (ST41), cutting the flat silicon wafer deposited with the thin film layers (ST42); grinding the cut flat silicon wafers (ST43); and attaching the grinded flat silicon wafers to each other (ST44). When X-rays and γ-rays are applied to the MLL, X-ray and γ-ray beams are focused by diffraction. In the deposition of the flat silicon wafer, since the thinnest outermost layer is first deposited, defects in the important portion thereof determining a light focusing effect must be minimized. One zone plate is obtained by facing two multilayer thin film sections each other. In this case, when an MLL (slanted MLL) is rotated by a Bragg diffraction angle (θB=0.05-0.3°), a focusing efficiency higher than that of a flat MLL can be obtained. Further, when beam transmission depth is determined by a cutting-grinding process, a very high aspect ratio (the ratio of outermost layer thickness of 5 nm to beam transmission depth of 10 μm is 2000) can be obtained, so the focusing efficiency of the MLL is several ten times higher than that of a general Fresnel zone plate. Basically, since an MLL is a one-dimensional focusing lens, two MLLs must intersect each other.

An MLL is identical to a Fresnel zone plate in a conception, but is a novel lens that can overcome the problems associated with a Fresnel zone plate because its manufacturing method is excellent. However, this MLL manufacturing method is problematic in that an MLL is fabricated on a flat surface, so X-rays and γ-rays can be focused in only one direction, and X-rays and γ-rays cannot be focused in a circular shape.

DISCLOSURE

Technical Problem

An object of the present invention is to provide a method of manufacturing an X-ray/γ-ray focusing optical system including a structure for focusing X-rays and γ-rays, in which the thickness of the outermost layer of the structure can be controlled at a level of unit of an atomic layer, and an X-ray/γ-ray focusing optical system manufactured by the method.

Another object of the present invention is to provide an X-ray/γ-ray focusing optical system including an outermost layer having a high aspect ratio and finely-controllable various types of focusing structures.

Technical Solution

In order to accomplish the above objects, an aspect of the present invention provides a method of manufacturing an X-ray/γ-ray focusing optical system, including the steps of: providing a capillary substrate; and sequentially accumulating a plurality of alternation layers, each consisting of an X-ray/γ-ray opaque material and an X-ray/γ-ray transparent material, on an inner surface of the capillary substrate in a Fresnel pattern by atomic layer deposition.

Preferably, in the step of accumulating the plurality of alternation layers, the thickness of each of the layers may be controlled such that an innermost layer adjacent to the inner surface of the capillary substrate has a minimum thickness, and an outermost layer far away from the inner surface of the capillary substrate has a maximum thickness.

Preferably, the atomic layer deposition may include the steps of: injecting a precursor gas of a material to be deposited, which is selected from among the X-ray/γ-ray opaque material and the X-ray/γ-ray transparent material, into a capillary tube to adsorb the precursor gas onto an inner surface of the capillary tube; removing a residual precursor gas from the inner surface of the capillary tube, the residual precursor gas in the precursor gas injected into the capillary tube having not been adsorbed on the inner surface of the capillary tube; injecting a reaction gas, which reacts with the precursor gas to produce the material to be deposited, into the capillary tube to adsorb the reaction gas onto the inner surface of the capillary tube; and removing a residual reaction gas from the inner surface of the capillary tube, the residual reaction gas in the reaction gas injected into the capillary tube having not been adsorbed on the inner surface of the capillary tube.

Preferably, the X-ray/γ-ray opaque material may be ruthenium (Ru), the precursor gas of ruthenium (Ru) may be selected from among $RuCp_2$, $Ru(EtCp)_2$, $Ru(od)_3$ and $Ru(thd)_3$, the reaction gas of $RuCp_2$ may be selected from among air and oxygen, the reaction gas of $Ru(EtCp)_2$ may be selected from among oxygen and $NH_3$ plasma, the reaction gas of $Ru(EtCp)_2$ may be oxygen, and the reaction gas of $Ru(thd)_3$ may be selected from among air, oxygen and hydrogen. Here, Cp=cyclopentadienyl, Et=ethyl, od=2,4-octanedionato, and thd=2,2,6,6-tetramethyl-3,5-heptanedionato. The reaction mechanisms thereof are based on the oxidization of a ruthenium precursor by oxygen or the reduction of a ruthenium precursor by $NH_3$ plasma or hydrogen.

Further, preferably, the X-ray/γ-ray opaque material may be platinum (Pt), the precursor gas of platinum (Pt) may be selected from among $MeCpPtMe_3$ and $Pt(acac)_2$, the reaction gas of $MeCpPtMe_3$ may be selected from among air and oxygen and hydrogen, and the reaction gas of $Pt(acac)_2$ may be selected from among oxygen and hydrogen. Here, Me=methyl, and acac=acetylacetonato.

Further, preferably, the X-ray/γ-ray opaque material may be iridium (Ir), the precursor gas of iridium (Ir) may be $Ir(acac)_3$, and the reaction gas of $Ir(acac)_3$ may be selected from among air and oxygen and hydrogen.

Further, preferably, the X-ray/γ-ray opaque material may be palladium (Pd), the precursor gas of palladium (Pd) may be selected from among $Pd(hfac)_2$, $Pd(thd)_2$ and $Pd(keim2)_2$, the reaction gas of $Pd(hfac)_2$ may be selected from among hydrogen and glyoxylic acid+Ar carrier, the reaction gas of $Pd(thd)_2$ may be selected from among oxygen and hydrogen, and the reaction gas of $Pd(keim2)_2$ may be oxygen. Here, hfac=hexafluoroacetylacetonato, and keim2=$[CF_3C(O)CHC(NBu'')CF_3]^-$.

Further, preferably, the X-ray/γ-ray opaque material may be rhodium (Rh), the precursor gas of rhodium (Rh) may be selected from among $CpRh(CO)_2$ and $Rh(acac)_3$, the reaction gas of $CpRh(CO)_2$ may be oxygen, and the reaction gas of $Rh(acac)_3$ may be oxygen.

The atomic layer deposition conditions of such precious metals are concretely disclosed in the treatise "Atomic Layer Deposition of Noble Metal Thin Films" (written by Titta Aaltonen, University of Helsinki, 2005).

Preferably, the X-ray/γ-ray transparent material may be $Al_2O_3$, the precursor gas of $Al_2O_3$ is $Al(CH_3)$, and the reaction gas of $Al(CH_3)$ may be $H_2O$.

Preferably, the capillary tube may have a circular or rectangular cross section.

Preferably, the capillary tube may have a trapezoidal longitudinal section.

Preferably, the roughness of the inner surface of the capillary tube may be 1 nm to 10 nm.

Preferably, the capillary substrate may be made of glass or quartz.

Preferably, the X-ray/γ-ray focusing optical system may be a Fresnel zone plate or a multilayer Laue lens.

Advantageous Effects

According to the X-ray/γ-ray focusing optical system of the present invention, a structure including an outermost layer having a high aspect ratio (ratio of outermost layer thickness of 5 nm to beam transmission depth of 10 μm) can be fabricated because the thickness of the outermost layer of the structure can be controlled at a level of unit of an atomic layer. Further, according to the present invention, X-ray/γ-ray focusing optical systems (for example, a Fresnel zone plate and an MLL) including finely-controllable various types (for example, a circular cross section and a trapezoidal longitudinal section) of focusing structures for focusing X-rays and γ-ray can be manufactured.

BEST MODE

Hereinafter, preferred embodiments of the present invention will be described in detail with reference to the accompanying drawings.

Figure 1:
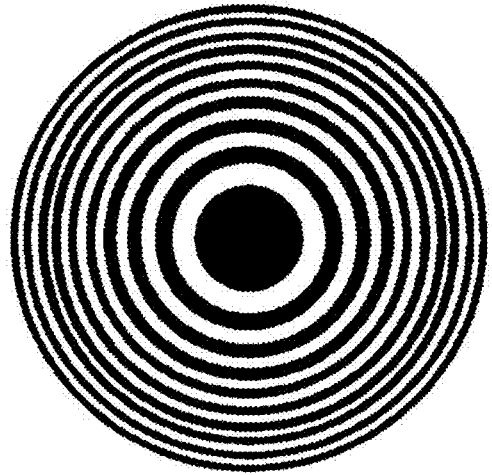
FIG. 1 is a cross-sectional view showing a typical Fresnel zone plate.
Figure 2:
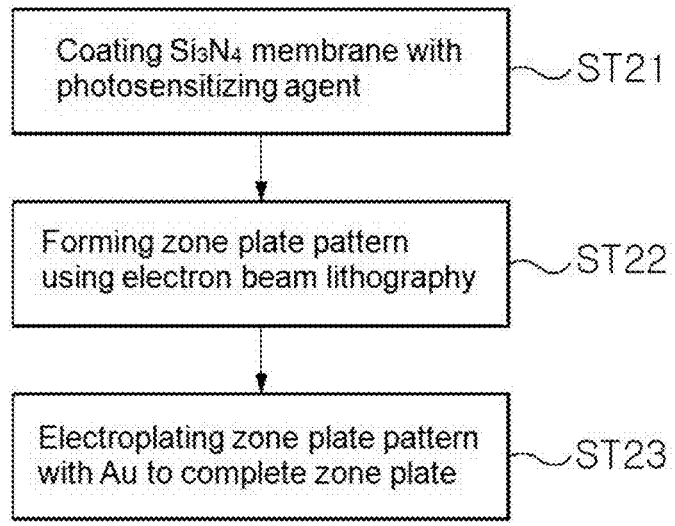
FIG. 2 is a flowchart showing a process of manufacturing a typical Fresnel zone plate using electron beam lithography and an electrochemical method.
Figure 3:
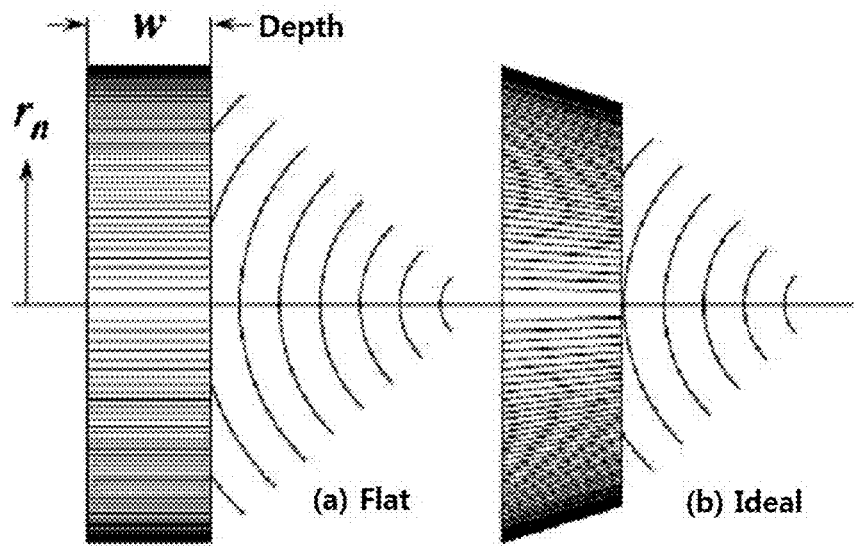
FIG. 3 (a) is a view showing a typical Fresnel zone plate having a flat longitudinal section, and FIG. 3 (b) is a view showing an ideal Fresnel zone plate having a trapezoidal longitudinal section.
Figure 4:
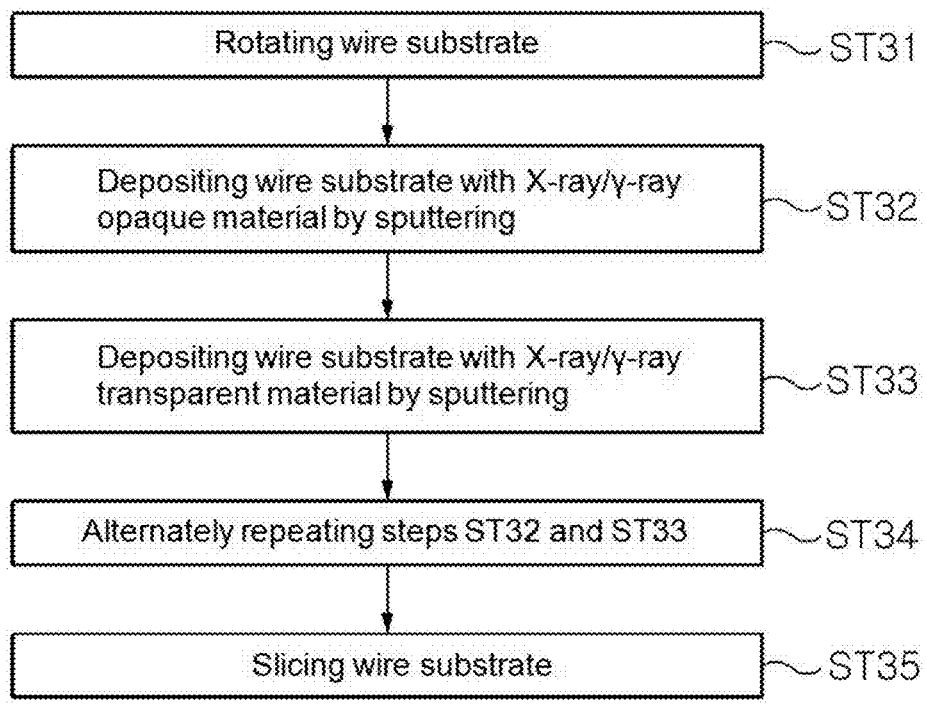
FIG. 4 is a flowchart showing a process of manufacturing a typical Fresnel zone plate using a sputter-slicing method.
Figure 5:
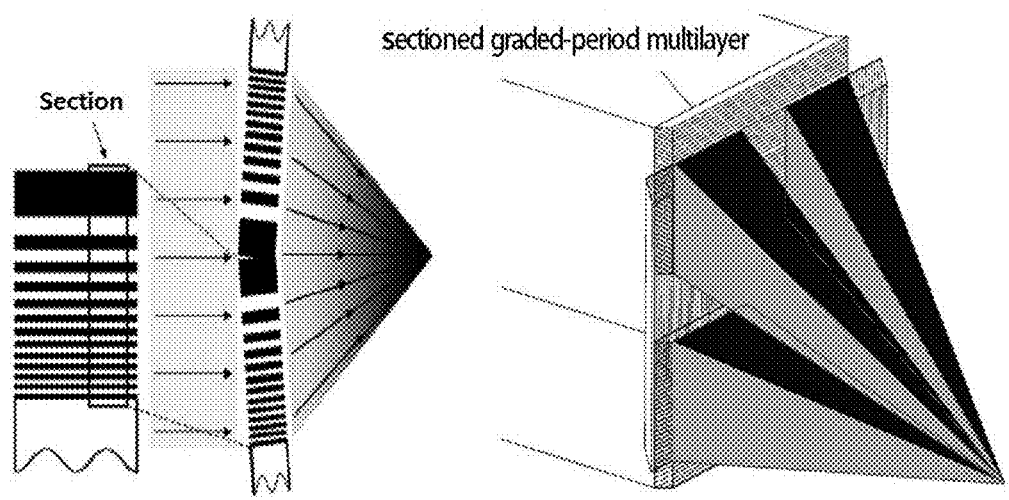
FIG. 5 shows a longitudinal-sectional view (left) for explaining a basic conception of a typical MLL and a cross-sectional view (right) for explaining a two-dimensional MLL.
Figure 6:
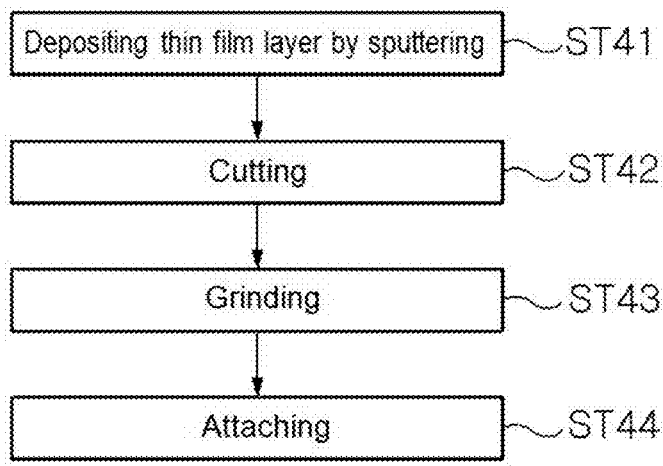
FIG. 6 is a flowchart showing a process of manufacturing a typical MLL using physical vapor deposition (PVD).
Figure 7:
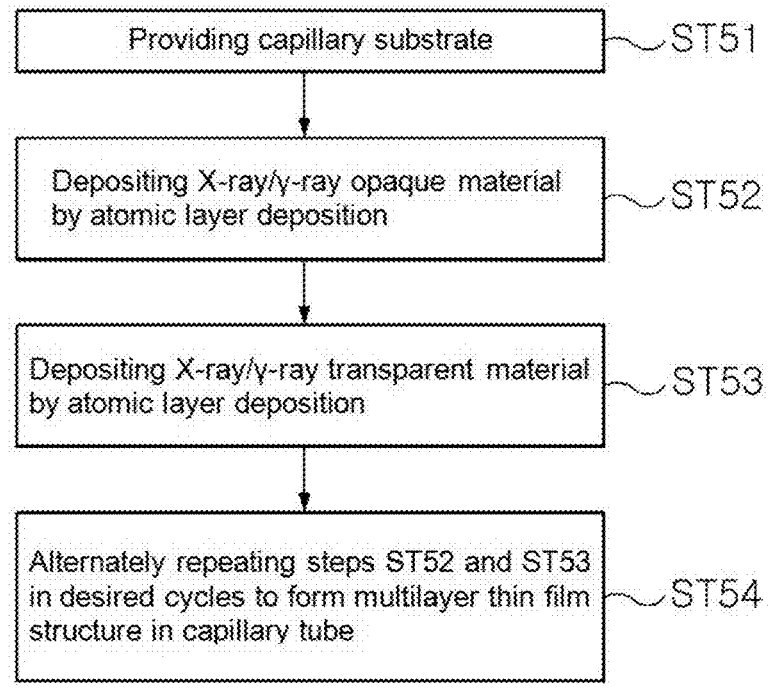
FIG. 7 is a flowchart showing a method of manufacturing an X-ray/γ-ray focusing optical system using atomic layer deposition according to an embodiment of the present invention.

Referring to FIG. 7, in the present invention, a capillary substrate is provided (ST51), and a plurality of alternation layers, each consisting of an X-ray/γ-ray opaque material and an X-ray/γ-ray transparent material, are sequentially accumulated on the inner surface of the capillary substrate in a Fresnel pattern by atomic layer deposition (ST52, ST53, ST54).

By virtue of such atomic layer deposition, the thickness of the outermost layer of a multilayer thin film structure constituting an X-ray/γ-ray focusing optical system can be controlled at a level of unit of an atomic layer, and thus an X-ray/γ-ray focusing optical system having a high aspect ratio (the thickness of the outermost layer is 1 nm or less, and the depth of light transmission is 1 μm or more) and a high resolution (20 nm or less) can be manufactured.

Generally, each of the layers of the multilayer thin film structure is deposited in a Fresnel pattern. In the step of accumulating the plurality of alternation layers, the thickness of each of the layers of the multilayer thin film structure is controlled such that the innermost layer adjacent to the inner surface of the capillary substrate has a minimum thickness, and the outermost layer far away from the inner surface of the to capillary substrate has a maximum thickness.

More specifically, each of the layers of the multilayer thin film structure is disposed at the position which is away from the origin by the distance given below:

$$r^2_n = n\lambda f + n^2 \lambda^2 / 4.$$

Here, $r_n$ is a position of an $n_{th}$ layer, and f is a focal distance. The second term may be omitted when $n\lambda \ll f$. The thickness $\Delta r$ of the outermost layer is $r_n - r_{n-1}$. The resolution of a Fresnel Zone Plate is approximately equal to the thickness $\Delta r$ of the outermost layer ($R = 1.22\Delta r$ when the Fresnel Zone Plate is a circular zone plate, and $R = \Delta r$ when the Fresnel Zone Plate is a linear zone plate).

Figure 8A:
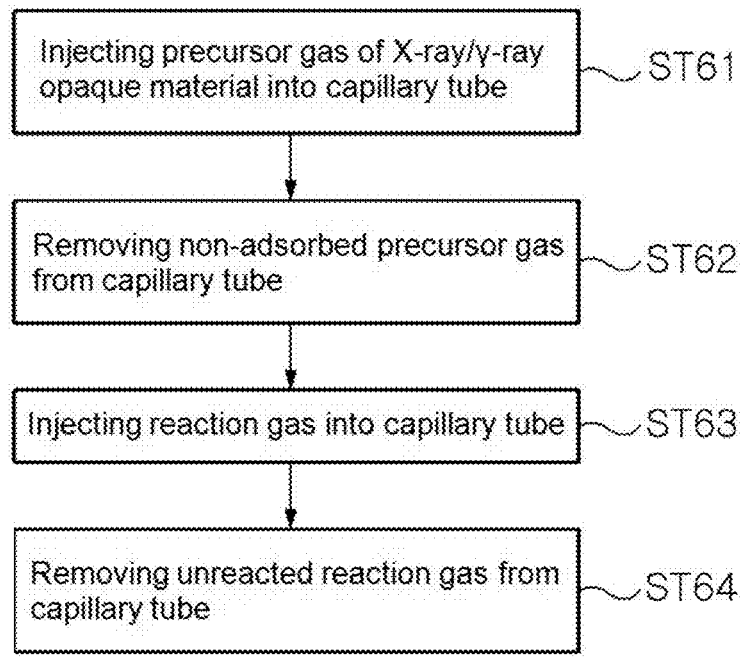
FIG. 8a is a flowchart showing a process of depositing an X-ray/γ-ray opaque material using atomic layer deposition according to an embodiment of the present invention.

In the present invention, as shown in FIG. 8a, the step (ST52) of the atomic layer deposition of the X-ray/γ-ray opaque material constituting the plurality of alternation layers may include the steps of: injecting a precursor gas of a material to be deposited, which is selected from among the X-ray/γ-ray opaque material and the X-ray/γ-ray transparent material, into a capillary tube to adsorb the precursor gas onto an inner surface of the capillary tube (ST61); removing a residual precursor gas from the inner surface of the capillary tube by purging, the residual precursor gas in the precursor gas injected into the capillary tube having not been adsorbed on the inner surface of the capillary tube (ST62); injecting a reaction gas, which reacts with the precursor gas to produce the material to be deposited, into the capillary tube to adsorb the reaction gas onto the inner surface of the capillary tube (ST63); and removing a residual reaction gas from the inner surface of the capillary tube, the residual reaction gas in the reaction gas injected into the capillary tube having not been adsorbed on the inner surface of the capillary tube (ST64).

Preferably, as the X-ray/γ-ray opaque material, Au, Ru, Pt, Pd, Rh, W, Ir or Ag, which is a material having high electron density, may be used, more preferably Ru, Pt, Ir, Pd or Rh may be used, and most preferably Pt may be used. When these materials are arranged in order of suitableness as an opaque material, Au>Pt>Ir>W>Ru>>Ag>Pd>Rh. Here, Au is difficult to be used as the opaque material because its precursor does not exist yet, and generally used $HfO_2$, although not arranged as above, may also be used as the opaque material. A precursor gas of each of the opaque materials and a reaction gas suitable for the precursor gas are described in more detail as follows.

When ruthenium (Ru) is used as the X-ray/γ-ray opaque material, the precursor gas of ruthenium (Ru) may be selected from among $RuCp_2$, $Ru(EtCp)_2$, $Ru(od)_3$ and $Ru(thd)_3$, the reaction gas of $RuCp_2$ may be selected from among air and oxygen, the reaction gas of $Ru(EtCp)_2$ may be selected from among oxygen and $NH_3$ plasma, the to reaction gas of $Ru(EtCp)_2$ may be oxygen, and the reaction gas of $Ru(thd)_3$ may be selected from among air, oxygen and hydrogen.

When platinum (Pt) is used as the X-ray/γ-ray opaque material, the precursor gas of platinum (Pt) may be selected from among MeCpPtMe$_3$ and Pt(acac)$_2$, the reaction gas of MeCpPtMe$_3$ may be selected from among air and oxygen and hydrogen, and the reaction gas of Pt(acac)$_2$ may be selected from among oxygen and hydrogen.

When iridium (Ir) is used as the X-ray/γ-ray opaque material, the precursor gas of iridium (Ir) may be Ir(acac)$_3$, and the reaction gas of Ir(acac)$_3$ may be selected from among air, oxygen and hydrogen.

When palladium (Pd) is used as the X-ray/γ-ray opaque material, the precursor gas of palladium (Pd) may be selected from among Pd(hfac)$_2$, Pd(thd)$_2$ and Pd(keim2)$_2$, the reaction gas of Pd(hfac)$_2$ may be selected from among hydrogen and glyoxylic acid+Ar carrier, the reaction gas of Pd(thd)$_2$ may be selected from among oxygen and hydrogen, and the reaction gas of Pd(keim2)$_2$ may be oxygen.

When rhodium (Rh) is used as the X-ray/γ-ray opaque material, the precursor gas of rhodium (Rh) may be selected from among CpRh(CO)$_2$ and Rh(acac)$_3$, the reaction gas of CpRh(CO)$_2$ may be oxygen, and the reaction gas of Rh(acac)$_3$ may be oxygen.

Figure 8B:
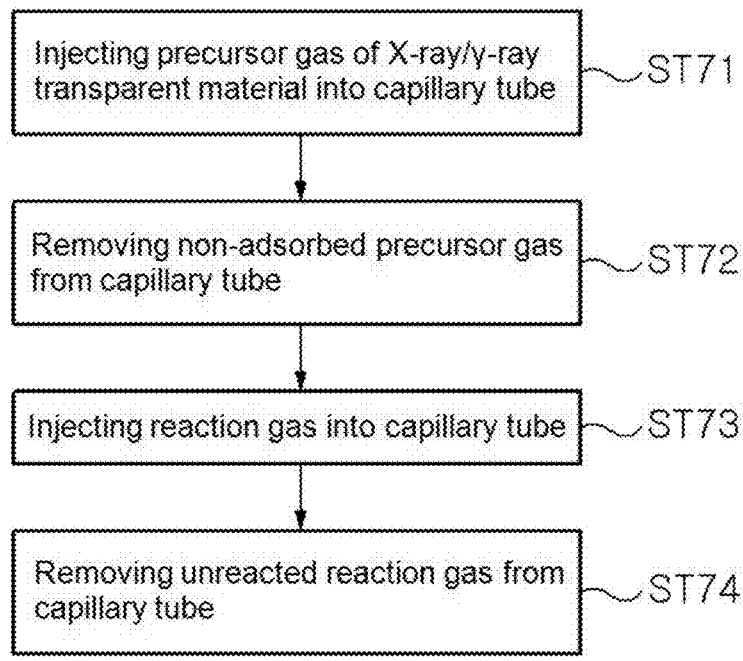
FIG. 8b is a flowchart showing a process of depositing an X-ray/γ-ray transparent material using atomic layer deposition according to an embodiment of the present invention.

Next, in the present invention, the step (ST53) of the atomic layer deposition of the X-ray/γ-ray transparent material constituting the plurality of alternation layers is basically identical with the step (ST52) of the atomic layer deposition of the X-ray/γ-ray opaque material, except that an X-ray/γ-ray transparent material is used as a material to be deposited instead of an X-ray/γ-ray opaque material, and a precursor gas of the transparent material and a reaction gas of the precursor gas are changed. As shown in FIG. 8*b*, the step (ST53) of the atomic layer deposition of the X-ray/γ-ray transparent material may include the steps of: injecting a precursor gas of the X-ray/γ-ray transparent material into a capillary tube (ST71); removing a residual precursor gas from the capillary tube, the residual precursor gas having not been adsorbed on the inner surface of the capillary tube (ST72); injection a reaction gas into the capillary tube (ST73); and removing the unreacted reaction gas from the capillary tube (ST74).

Preferably, as the X-ray/γ-ray transparent material, C, Al$_2$O$_3$ or silicon nitride may be used, and more preferably Al$_2$O$_3$ may be used. In this case, the precursor gas of Al$_2$O$_3$ may be Al(CH$_3$), and the reaction gas of Al(CH$_3$) may be H$_2$O.

As described above, when the X-ray/γ-ray opaque material and the X-ray/γ-ray transparent material are alternately and repeatedly accumulated on the inner surface of the capillary substrate in desired cycles according to a Fresnel pattern, a multilayer thin to film structure is formed in the capillary substrate (ST54).

This multilayer thin film structure is configured such that monoatomic layers made of the X-ray/γ-ray opaque material and monoatomic layers made of the X-ray/γ-ray transparent material are alternately and repeatedly arranged to form a concentric circle. The relationship between total multilayer thin film structure thickness, cycle number and monoatomic layer thickness is represented by the following Equation:

$$\text{(Total thickness of multilayer thin film structure)} = \sum_{i}^{m} (\text{cycle number})_m \times (\text{monoatomic layer thickness})_m$$

Advantageously, the shapes of the sections (cross section and longitudinal section) of the multilayer thin film structure formed in the capillary substrate by atomic layer deposition can be controlled only by changing the shapes of the sections (cross section and longitudinal section) of the capillary substrate used in the method of manufacturing an X-ray/γ-ray focusing optical system according to the present invention.

Figure 9:
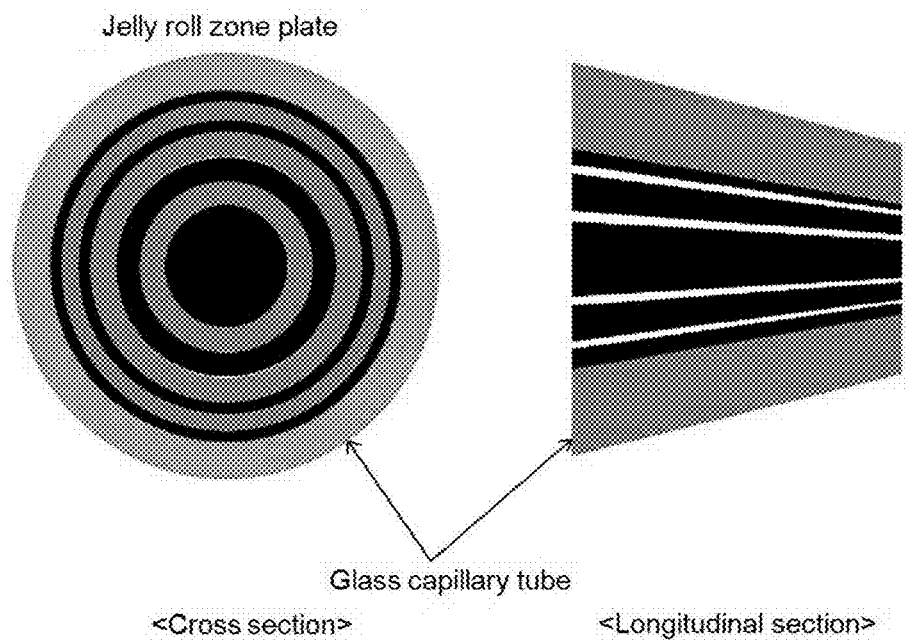
FIG. 9 is a view showing the cross section and longitudinal section of the X-ray/γ-ray focusing optical system manufactured according to an embodiment of the present invention.

For example, when the capillary substrate has a circular cross section, the multilayer thin film structure formed in the capillary substrate by atomic layer deposition also has a circular cross section corresponding to that of the capillary substrate (circular Fresnel zone plate and circular MLL can be manufactured). Further, when the capillary substrate has a trapezoidal longitudinal section, as shown in FIG. 9, the multilayer thin film structure formed in the capillary substrate by atomic layer deposition also has a trapezoidal longitudinal section corresponding to that of the capillary substrate (ideal Fresnel zone plate and ideal MLL can be manufactured).

It is preferred that the capillary substrate used in the present invention be made of glass or quartz, which is a material physically and chemically stable under atomic layer deposition process conditions (150~300□, precursor gas in vacuum/atmospheric pressure). Further, it is preferred that the roughness of the inner surface of the capillary substrate be 1 nm to 10 nm because it must be small compared to the line width of the outermost layer of a zone plate.

MODE FOR INVENTION

Example

1. Providing of a Capillary Substrate

There was provided a capillary substrate which is made of glass or quartz and is to physically and chemically stable under atomic layer deposition process conditions (150~300□, precursor gas in vacuum/atmospheric pressure), the inner surface roughness of which is 1 nm to 10 nm and which has a circular cross section and a trapezoidal longitudinal section.

2. Formation of a Multilayer Thin Film by Atomic Layer Deposition

An X-ray/γ-ray opaque material and an X-ray/γ-ray transparent material were alternately and repeatedly accumulated on the inner surface of the provided capillary substrate in a Fresnel pattern by atomic layer deposition to form a multilayer thin film.

(1) Deposition of an X-Ray/γ-Ray Opaque Material

MeCpPtMe$_3$, which is a precursor gas of platinum (Pt) that is material opaque to X-rays/γ-rays, was volatilized at room temperature slightly lower than 30□ (a melting point thereof). The vapor pressure of MeCpPtMe$_3$ at room temperature is comparatively high. MeCpPtMe$_3$ must be treated under an inert gas atmosphere because it reacts with air. The volatilized precursor gas (MeCpPtMe$_3$) was injected into a capillary tube to adsorb the precursor gas (MeCpPtMe$_3$) onto the inner surface of the capillary tube.

The residual precursor gas (MeCpPtMe$_3$), which had not been adsorbed on the inner surface of the capillary tube, was removed from the capillary tube by purging, while introducing nitrogen gas (N$_2$) into the capillary tube.

A reaction gas (air or O$_2$) was injected into the capillary tube to adsorb the reaction gas (air or O$_2$) onto the inner surface of the capillary tube until an X-ray/γ-ray opaque layer made of Pt had a predetermined thickness according to a Fresnel pattern.

When oxygen was used as the reaction gas, a platinum film was obtained at a temperature of 300□ or higher. The thermal self-decomposition of MeCpPtMe₃ became remarkable at a temperature of higher than 300□. Therefore, 300□ was set to the temperature upper limit in this process. Consequently, the reactivity of the precursor gas was increased at a temperature of lower than 300□ due to the increase in partial pressure of oxygen.

The residual reaction gas (air or O₂), which had not been adsorbed on the inner surface of the capillary tube, was removed from the capillary tube by purging, while introducing nitrogen gas (N₂) into the capillary tube.

(2) Deposition of an X-Ray/γ-Ray Transparent Material

Al(CH₃), which is a precursor gas of Al₂O₃ that is material transparent to X-rays/γ-rays, was injected into a capillary tube to adsorb the precursor gas (Al(CH₃)) onto the inner surface of the capillary tube.

The residual precursor gas (Al(CH₃)), which had not been adsorbed on the inner surface of the capillary tube, was removed from the capillary tube by purging, while introducing nitrogen gas (N₂) into the capillary tube.

A reaction gas (H₂O) was injected into the capillary tube to adsorb the reaction gas (H₂O) onto the inner surface of the capillary tube until an X-ray/γ-ray transparent layer made of Al₂O₃ had a predetermined thickness according to a Fresnel pattern.

The residual reaction gas (H₂O), which had not been adsorbed on the inner surface of the capillary tube, was removed from the capillary tube by purging, while introducing nitrogen gas (N₂) into the capillary tube.

(3) Formation of a Multilayer Thin Film Structure

The processes of (1) and (2) were alternately repeated in desired cycles to form a multilayer thin film structure in the capillary substrate.

According to an embodiment of the present invention, the thickness of the outermost layer of a multilayer thin film structure can be controlled at a level of unit of an atomic layer, so an ideal X-ray/γ-ray focusing optical system having a circular cross section and a trapezoidal longitudinal section as well as having a high aspect ratio (the thickness of the outermost layer is 1 nm or less, and the depth of light transmission is 1 μm or more) and a high resolution (20 nm or less) can be manufactured.

The invention claimed is:

1. A method of manufacturing an X-ray/γ-ray focusing optical system, comprising the steps of:
providing a capillary substrate; and
sequentially accumulating a plurality of alternation layers, each consisting of an X-ray/γ-ray opaque material and an X-ray/γ-ray transparent material, on an inner surface of the capillary substrate in a Fresnel pattern by atomic layer deposition,
wherein, the capillary substrate is a capillary tube with a trapezoidal longitudinal section, and the atomic layer deposition comprises the steps of:
injecting a precursor gas of a material to be deposited, which is selected from among the X-ray/γ-ray opaque material and the X-ray/γ-ray transparent material, into a capillary tube to adsorb the precursor gas onto an inner surface of the capillary tube;
removing a residual precursor gas from the inner surface of the capillary tube, the residual precursor gas in the precursor gas injected into the capillary tube having not been adsorbed on the inner surface of the capillary tube;
injecting a reaction gas, which reacts with the precursor gas to produce the material to be deposited, into the capillary tube to adsorb the reaction gas onto the inner surface of the capillary tube; and
removing a residual reaction gas from the inner surface of the capillary tube, the residual reaction gas in the reaction gas injected into the capillary tube having not been adsorbed on the inner surface of the capillary tube.

2. The method of manufacturing an X-ray/γ-ray focusing optical system according to claim 1, wherein, in the step of accumulating the plurality of alternation layers, the thickness of each of the layers is controlled such that an innermost layer adjacent to the inner surface of the capillary substrate has a minimum thickness, and an outermost layer far away from the inner surface of the capillary substrate has a maximum thickness.

3. The method of manufacturing an X-ray/γ-ray focusing optical system according to claim 1, wherein the X-ray/γ-ray opaque material is ruthenium (Ru), the precursor gas of ruthenium (Ru) is selected from among $RuCp_2$, $Ru(EtCp)_2$, $Ru(od)_3$ and $Ru(thd)_3$, the reaction gas of $RuCp_2$ is selected from among air and oxygen, the reaction gas of $Ru(EtCp)_2$ is selected from among oxygen and $NH_3$ plasma, the reaction gas of $Ru(EtCp)_2$ is oxygen, and the reaction gas of $Ru(thd)_3$ is selected from among air, oxygen and hydrogen.

4. The method of manufacturing an X-ray/γ-ray focusing optical system according to claim 1, wherein the X-ray/γ-ray opaque material is platinum (Pt), the precursor gas of platinum (Pt) is selected from among MeCpPtMe₃ and $Pt(acac)_2$, the reaction gas of MeCpPtMe₃ is selected from among air and oxygen and hydrogen, and the reaction gas of $Pt(acac)_2$ is selected from among oxygen and hydrogen.

5. The method of manufacturing an X-ray/γ-ray focusing optical system according to claim 1, wherein the X-ray/γ-ray opaque material is iridium (Ir), the precursor gas of iridium (Ir) is $Ir(acac)_3$, and the reaction gas of $Ir(acac)_3$ is selected from among air, oxygen and hydrogen.

6. The method of manufacturing an X-ray/γ-ray focusing optical system according to claim 1, wherein the X-ray/γ-ray opaque material is palladium (Pd), the precursor gas of palladium (Pd) is selected from among $Pd(hfac)_2$, $Pd(thd)_2$ and $Pd(keim2)_2$, the reaction gas of $Pd(hfac)_2$ is selected from among hydrogen and glyoxylic acid+Ar carrier, the reaction gas of $Pd(thd)_2$ is selected from among oxygen and hydrogen, and the reaction gas of $Pd(keim2)_2$ is oxygen.

7. The method of manufacturing an X-ray/γ-ray focusing optical system according to claim 1, wherein the X-ray/γ-ray opaque material is rhodium (Rh), the precursor gas of rhodium (Rh) is selected from among $CpRh(CO)_2$ and $Rh(acac)_3$, the reaction gas of $CpRh(CO)_2$ is oxygen, and the reaction gas of $Rh(acac)_3$ is oxygen.

8. The method of manufacturing an X-ray/γ-ray focusing optical system according to claim 1, wherein the X-ray/γ-ray transparent material is $Al_2O_3$, the precursor gas of $Al_2O_3$ is $Al(CH_3)$, and the reaction gas of $Al(CH_3)$ is $H_2O$.

9. The method of manufacturing an X-ray/γ-ray focusing optical system according to claim 1, wherein the capillary tube has a circular or rectangular cross section.

10. The method of manufacturing an X-ray/γ-ray focusing optical system according to claim 1, wherein the roughness of the inner surface of the capillary tube is 1 nm to 10 nm.

11. The method of manufacturing an X-ray/γ-ray focusing optical system according to claim 1, wherein the capillary substrate is made of glass or quartz.

12. The method of manufacturing an X-ray/γ-ray focusing optical system according to claim 1, wherein the X-ray/γ-ray focusing optical system is a Fresnel zone plate or a multilayer Laue lens.

* * * * *